(12) United States Patent
Tsutsui et al.

(10) Patent No.: US 7,193,471 B2
(45) Date of Patent: Mar. 20, 2007

(54) HIGH FREQUENCY POWER AMPLIFIER CIRCUIT AND RADIO COMMUNICATION SYSTEM

(75) Inventors: Takayuki Tsutsui, Saku (JP); Shinji Yamada, Takasaki (JP); Yasuhiro Nunogawa, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/520,717

(22) Filed: Sep. 14, 2006

(65) Prior Publication Data

US 2007/0008037 A1    Jan. 11, 2007

Related U.S. Application Data

(63) Continuation of application No. 11/033,874, filed on Jan. 13, 2005, now Pat. No. 7,123,095.

(30) Foreign Application Priority Data

Feb. 12, 2004    (JP) .............................. 2004-034967

(51) Int. Cl.
    *H03G 3/10*    (2006.01)
(52) U.S. Cl. .................. 330/285; 330/310; 330/85; 330/297
(58) Field of Classification Search ................ 330/285, 330/310, 85, 297, 279, 98
    See application file for complete search history.

(56) References Cited

U.S. PATENT DOCUMENTS

| | | | |
|---|---|---|---|
| 5,325,073 A | 6/1994 | Hasegawa | |
| 5,493,255 A | 2/1996 | Murtojarvi | |
| 5,589,796 A | 12/1996 | Alberth et al. | |
| 5,884,153 A | 3/1999 | Okada | |
| 6,172,567 B1 | 1/2001 | Ueno et al. | |
| 6,753,735 B2 | 6/2004 | Arai et al. | |
| 6,972,626 B2 | 12/2005 | Takahashi et al. | |
| 6,990,323 B2 * | 1/2006 | Prikhodko et al. | .......... 455/126 |
| 7,034,617 B2 | 4/2006 | Takahashi et al. | |
| 2003/0054780 A1 | 3/2003 | Nunogawa et al. | |

FOREIGN PATENT DOCUMENTS

| | | |
|---|---|---|
| JP | 2000-151310 | 5/2000 |
| JP | 2003-116789 | 4/2003 |
| JP | 2004-328107 | 11/2004 |
| WO | WO 99/29037 | 6/1999 |

* cited by examiner

*Primary Examiner*—Patricia Nguyen
(74) *Attorney, Agent, or Firm*—Mattingly, Stanger, Malur & Brundidge, P.C.

(57) ABSTRACT

There is provided a high frequency power amplifier circuit capable of enhancing detection accuracy of an output level, necessary for feedback control of the high frequency power amplifier circuit, and capable of executing output power control with higher precision. With the high frequency power amplifier circuit, the detection of the output level, necessary for feedback control of the high frequency power amplifier circuit is executed by use of a current detection method, and in an electronic device comprising a differential amplifier for comparing an output power detection signal with an output level designation signal and for generating a signal for controlling a gain of the high frequency power amplifier circuit according to a potential difference between the two signals, a power source voltage with variation less than that for the power source voltage of the high frequency power amplifier circuit is used as the operational power source voltage of the output power detection circuit. Further, there is provided a capacitor across which an AC component is taken out from the output side of a power amplification transistor in the final amplification stage of the high frequency power amplifier circuit to be thereby impressed to the interior of the output power detection circuit.

4 Claims, 12 Drawing Sheets

HIGH FREQUENCY POWER AMPLIFIER CIRCUIT AND RADIO COMMUNICATION SYSTEM

CROSS-REFERENCE TO RELATED APPLICATION

This application is a continuation of U.S. patent application Ser. No. 11/033,874, filed Jan. 13, 2005, now U.S. Pat. No. 7,123,095 which is incorporated by reference herein in its entirety.

The present application claims priority from Japanese application No. 2004-034967 filed on Feb. 12, 2004, the content of which is hereby incorporated by reference into this application.

BACKGROUND OF THE INVENTION

The present invention relates to techniques effective upon application to a high frequency power amplifier circuit used in a radio communication system such as a cellular phone, and so forth, for amplifying and outputting high frequency signals, and the radio communication system using the same, and more particularly, to techniques for improving detection accuracy of output power of a radio communication system having a detection circuit for executing detection of output power, necessary for feedback control of a high frequency power amplifier circuit, by use of a current detection method.

Generally, a high frequency power amplifier circuit for amplifying signals after modulated is installed in an output unit at the transmitting end of a radio communication device (mobile radio communication device) such as a cellular phone, and so forth. A conventional radio communication device is provided with an automatic power control circuit (APC circuit) for generating an output control signal Vapc for effecting feedback control of a high frequency power amplifier circuit by detecting an output level of the high frequency power amplifier circuit to compare a transmit demand level (an output level designation signal) with a detection signal in order to control an amplification factor of the high frequency power amplifier circuit such that output power corresponds to the transmit demand level delivered from a base band circuit or a control circuit of a microprocessor and so forth (refer to, for example, Patent Document 1). Detection of an output level, necessary for the feedback control, has generally been executed by use of a coupler in the past.

A detection method of the output level of the conventional high frequency power amplifier circuit, using the coupler, renders it difficult to downsize a module. Further, in the case of using the coupler, there are times when a reference voltage is impressed on one end of the coupler in order to enhance detection sensitivity. In such a case, a drawback results in that a burden on a set maker will increase because of the needs for optimum setting of the reference voltage, and adjustment in voltage and so forth, according to variations in components. The use of the coupler also results in a drawback in that a relatively large power loss will occur.

Accordingly, the applicant for the present invention have developed the invention relating to a radio communication system based on a current detection method, comprising a current detection transistor for receiving an input signal of a power amplification transistor for amplifying a high frequency signal, and outputting a current proportional to a current flowing in the power amplification transistor, and a current mirror circuit for transferring the current of the current detection transistor, wherein a current generated by the current mirror circuit is converted into a voltage to serve as an output level detection signal, thereby controlling an output level by comparing the output level as detected with a transmit demand level, and have since submitted an application for the patent (Patent Document 2).

[Patent Document 1] Japanese Unexamined Patent Publication No. 2000-151310

[Patent Document 2] Japanese Patent Application No. 2000-523757

SUMMARY OF THE INVENTION

FIG. 12 is a block diagram broadly showing a feedback control system of a high frequency power amplifier circuit developed by the applicant, having an output power detection circuit based on a current detection method. In FIG. 12, reference numeral 10 denotes a power amplifier circuit for amplifying a high frequency signal Pin, 20 an output power detection circuit for detecting an output level of the power amplifier circuit 10, and outputting a current corresponding to the output level, 40 a resistor functioning as current-voltage conversion means for converting an output current from the output power detection circuit 20 into a voltage, and 50 a differential amplifier (APC circuit) for comparing an output voltage of the current-voltage conversion means 40 with an output level designation signal Vramp delivered from a base band circuit or a control circuit of a microprocessor and so forth. The feedback control system has a configuration such that a control signal Vapc according to an input potential difference is generated by the differential amplifier 50 to be fed to the power amplifier 10, thereby controlling output power by controlling a gain of the power amplifier 10.

The output power detection circuit 20 comprises a detection transistor Q1 with a gate terminal on which a signal identical to an input signal of a power amplification transistor (not shown) in the final amplification stage of the power amplifier 10 is impressed via a resistor R1, a current mirror transistor Q2 connected in series to the transistor Q1 via a resistor R2, a transistor Q3 connected in current mirror fashion to the transistor Q2, and a square root conversion circuit 21 for converting a drain current of the transistor Q3 into a current equivalent to the square root of the drain current, and by suitably setting a size ratio n of the power amplification transistor to the detection transistor Q1 (for example, n=10), a current proportional to a current flowing in the power amplification transistor is caused to flow in the detection transistor Q1. Further, the current of the transistor Q1 is transferred to the transistor Q3 by a current mirror circuit comprising the transistors Q2, Q3, so that a drain current flowing in the transistor Q3 is turned into a current have a correlation with output power of the power amplification transistor. The square root conversion circuit 21 is provided in order to improve control sensitivity in low output power regions, and techniques related therewith are disclosed in the application for patent, previously submitted by the applicant (refer to Japanese Patent Application No. 2003-116789).

With the output power detection circuit based on the current detection method, described as above, detection accuracy is enhanced to the extent that a bias condition of the power amplification transistor in the final amplification stage of the power amplifier is identical to a bias condition of the detection transistor Q1. Accordingly, for an operational power source voltage of the output power detection circuit 20, a power source voltage (generally, a voltage from a battery) identical to an operational power source voltage of the power amplification transistor in the final amplification stage has been used. Further, a cellular phone of the GSM mode is operated with the power amplification transistor in the final amplification stage, in a state close to a saturation region. Accordingly, in a circuitry shown in FIG. 12, the resistor R2 connects the detection transistor Q1 to the current mirror transistor Q2, thereby checking a drain voltage of the detection transistor Q1, so that a bias state of the detection transistor Q1 is caused to be in a state close to a saturation state. As a result, the detection accuracy of the output power detection circuit 20 has been fairly enhanced.

However, a lithium battery used in the cellular phone at present is at a high voltage around 4.6V immediately after charging, and in contrast, the battery is at a low voltage around 3.1V after it is discharged to a voltage level requiring recharging. Consequently, in the case where a power source voltage Vdd is at the maximum value (4.6V) or at the minimum value (3.1V), if a deviation of output power Pout, that is, a variation $\Delta$ Pout from the output power Pout at the standard value (3,5V) is shown in the figure, $\Delta$ Pout is seen undergoing a change so as to form a large swell, depending on the magnitude of the output power Pout, and at the same time, behavior of variation in $\Delta$ Pout when the output power Pout is increased with the power source voltage Vdd at the maximum value is seen contradictory to that with the power source voltage vdd at the minimum value, as shown in FIG. 13.

Accordingly, there is the need for large table data for providing the output level designation signal Vramp in order to compensate for the variation in $\Delta$ Pout, so that a storage capacity of a memory for storing the table data needs to be increased while a period for preparing such table data is lengthened, thereby causing a problem of an increase in the cost of software as well as hardware. Incidentally, a graph shown in FIG. 13 is concerned with a circuit for impressing an AC component taken out from the output terminal of the power amplification transistor in the final amplification stage, via a capacitor C0, on a node interconnecting the transistor Q2, and the resistor R2, as indicated by a broken line, in the circuitry shown in FIG. 12. The function of the capacitor C0 will be elaborated later in description.

It is an object of the invention to provide a high frequency power amplifier circuit capable of lessening dependency of a deviation of output power on a power source voltage, and reducing an amount of table data for compensating for the variation of the output power, thereby enabling cost to be reduced by shortening a time period for preparation of the table data while decreasing storage capacity as required, in a radio communication system executing detection of an output level, necessary for feedback control of the high frequency power amplifier circuit, by use of a current detection method, and the radio communication system using the high frequency power amplifier circuit.

Further, another object of the invention is to provide a high frequency power amplifier circuit capable of enhancing detection accuracy of an output level, necessary for feedback control of the high frequency power amplifier circuit, and capable of executing output power control with higher precision, and a radio communication system using the same.

The above and other objects, and novel features of the present invention will be apparent from the following description of the preferred embodiments of the invention in conjunction with the accompanying drawings.

Representative embodiments of the invention, as disclosed under the present application, are summed up as follows.

More specifically, with a radio communication system for executing detection of an output level, necessary for feedback control of a high frequency power amplifier circuit, by use of a current detection method, comprising a differential amplifier for comparing an output power detection signal with an output level designation signal to thereby generate a signal for controlling a gain of the high frequency power amplifier circuit, according to a potential difference therebetween, a power source voltage less in variation than an operational power source voltage of the high frequency power amplifier circuit is used as an operational power source voltage of an output power detection circuit. Further, there is provided a capacitor across which an AC component is taken out from the output side of a power amplification transistor in the final amplification stage of the high frequency power amplifier circuit to be thereby impressed to the interior of the output power detection circuit.

With the adoption of means described as above, since the power source voltage small in variation is used as the operational power source voltage of the output power detection circuit, even if output power undergoes a change according to variation in the power source voltage, an operational power source voltage of a transistor detecting the change does not undergo much change, so that dependency of a deviation of the output power on the power source voltage can be lessened. Furthermore, by installing the capacitor across which the AC component is taken out from the output side of the power amplification transistor in the final amplification stage of the high frequency power amplifier circuit to be thereby impressed to the interior of the output power detection circuit, an output power level can be detected after allowing for the effect of reflected waves, so that detection accuracy can be enhanced, thereby enabling output power control to be effected with higher precision.

Further, a second detection transistor with a gate terminal on which an AC signal taken out from the output side of the power amplification transistor in the final stage of the high frequency power amplifier circuit is impressed, and a bias generation circuit for giving an operational point to the gate terminal of the second detection transistor are preferably provided so as to be parallel connected to a first detection transistor (current detection transistor) with a gate terminal on which a signal identical to an input signal of the power amplification transistor in the final amplification stage of the high frequency power amplifier circuit is impressed. By so doing, while the output power level can be detected after allowing for the effect of the reflected waves, the second detection transistor can be operated at any suitable operational point, so that the detection accuracy can be improved, thereby enabling the output power control to be effected with still higher precision.

Effects obtained by the representative embodiments of the invention, as disclosed under the present application, are briefly described as follows.

More specifically, with the radio communication system according to the invention, for executing the detection of the output level, necessary for the feedback control of the high frequency power amplifier circuit by use of the current detection method, the amount of the table data for compensating for the variation of the output power can be reduced by lessening the dependency of the deviation of the output power on the power source voltage, thereby achieving cost-down by shortening the time period for the preparation of the table data while decreasing the storage capacity as required, In addition, the invention has an advantageous effect in that the detection accuracy in the detection of the output level, necessary for the feedback control of the high frequency power amplifier circuit, is enhanced, thereby enabling the output power control to be effected with the higher precision.

DETAILED DESCRPTION OF THE PREFERRED EMBODIMENTS

Preferred embodiments of the invention are described hereinafter with reference to the accompanying drawings.

Figure 1:
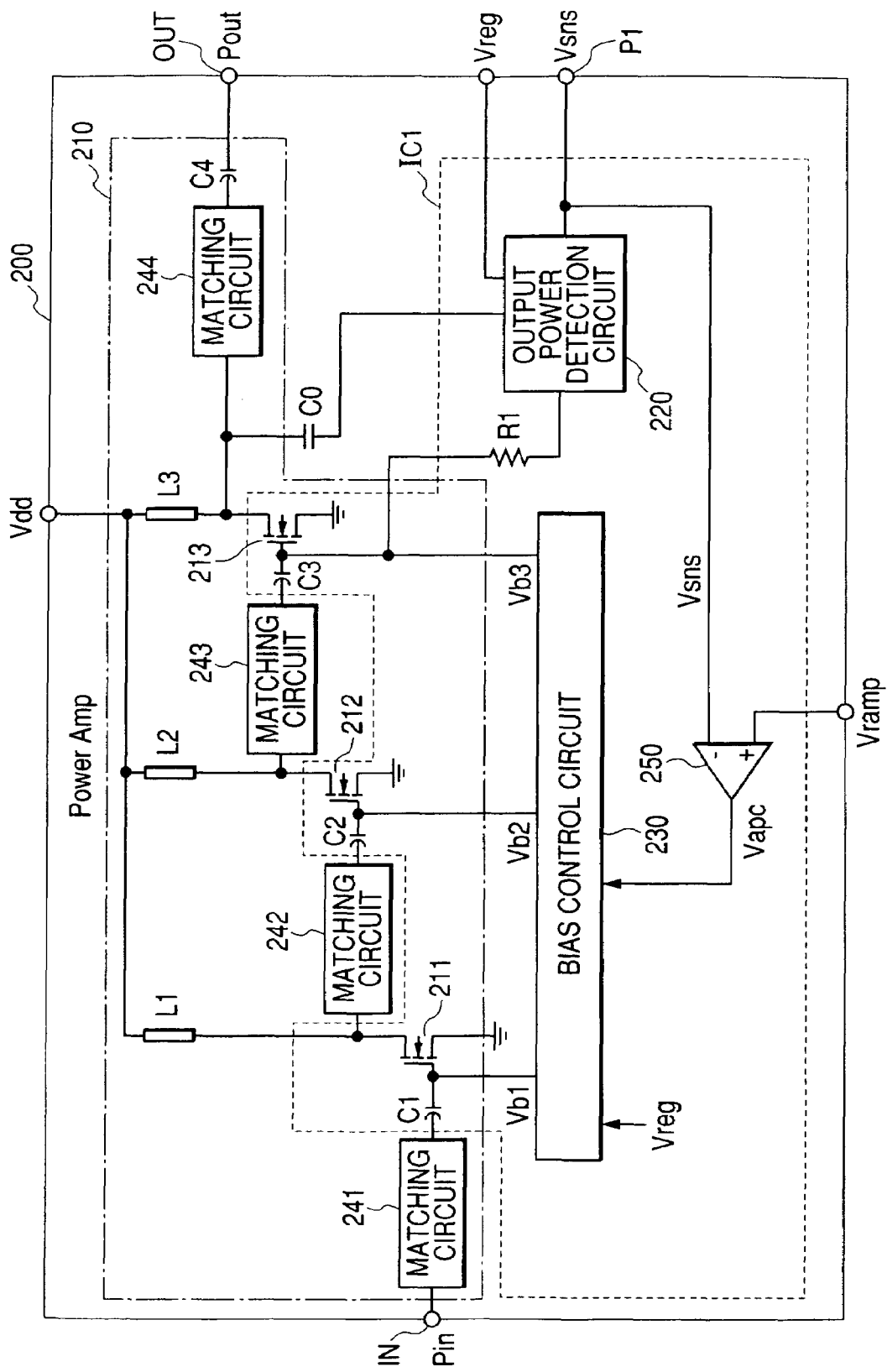
FIG. 1 is a block diagram broadly showing a configuration of an embodiment of a high frequency power amplifier (power module 200) according to the invention.

FIG. 1 is a block diagram broadly showing a configuration of an embodiment of a high frequency power amplifier (power module 200) according to the invention. In the present specification, a plurality of semiconductor chips and discrete components, mounted on an insulation board such as a ceramic board with printed wiring provided on the surface thereof, and therein, and configured so as to be handled as if it were one component by connecting respective elements with each other by means of the printed wiring, and respective bonding wires to enable the respective elements to fulfill predetermined functions, respectively, is referred to as a module.

A power module 200 according to the present embodiment comprises a high frequency power amplifier unit 210 including power amplification FETs (Field Effect Transistors) for amplifying an input high frequency signal Pin, respectively, an output power detection circuit 220 for detecting output power of the high frequency power amplifier unit 210, a bias control circuit 230 for providing the power amplification FETs in respective stages of the high frequency power amplifier unit 210 with a bias voltage to thereby control an idle current flowing to the respective FETs, and a differential amplifier (APC circuit) 250 for providing the bias control circuit 230 with a control voltage Vapc according to a potential difference obtained by comparing an output level designation signal Vramp delivered from an external base band unit with a detection voltage Vsns delivered from the output power detection circuit 220.

The high frequency power amplifier unit 210 according to the present embodiment comprises three units of the power amplification FETs 211, 212, 213 although not limited thereto, and the FETs 212, 213, in respective back stages, among the three units, have respective gate terminals connected to respective drain terminals of the FETs 211, 212, in stages preceding the FETs 212, 213, respectively, thereby constituting amplifier circuits in three stages as a whole. Further, gate bias voltages Vb1, Vb2, Vb3, supplied from the bias control circuit 230, are impressed on the respective gate terminals of the FETs 211, 212, 213, in the respective stages, thereby causing the idle currents corresponding to those voltages, respectively, to flow to the FETs 211, 212, 213, respectively. The bias control circuit 230 may be either of a resistance division type for generating the gate bias voltages Vb1, Vb2, Vb3 through resistance division, or of a current mirror bias type for generating the gate bias voltages Vb1, Vb2, Vb3 by use of FETs connected in current mirror fashion to the FETs 211, 212, 213, in the respective stages.

A power source voltage vdd is impressed on the respective drain terminals of the FETs 211, 212, 213, in the respective stages, through the intermediary of inductors L1, L2, L3, respectively. An impedance matching circuit 241, and a capacitive element C1 for DC cut are provided between the gate terminal of the FET 211 in the initial stage, and an input terminal IN, and the high frequency signal Pin is delivered to the gate terminal of the FET 211 through the intermediary of the impedance matching circuit, and the capacitive element.

An impedance matching circuit 242, and a capacitive element C2 for DC cut connect the drain terminal of the FET 211 in the initial stage to the gate terminal of the FET 212 in the second stage. Further, an impedance matching circuit 243, and a capacitive element C3 for DC cut connect the drain terminal of the FET 212 in the second stage to the gate terminal of the FET 213 in the final stage. The drain terminal of the FET 213 in the final stage is connected to an output terminal OUT through the intermediary of an impedance matching circuit 244, and a capacitive element C4, thereby sending out a signal Pout from an output terminal OUT after cutting a DC component of the input high frequency signal Pin, and amplifying an AC component thereof.

Further, with the present embodiment, for the power amplification FETs 211, 212, 213, use is made of a MOS transistor referred to as the so-called LDMOS (Laterally Diffused MOSFET) with terminals laterally diffused over a chip, respectively. Furthermore, a portion of the power module 200 according to the present embodiment, surrounded by a broken line, is turned into a semiconductor integrated circuit although not particularly limited thereto. Then, this semiconductor integrated circuit IC1, the inductors L1, L2, L3 of the high frequency power amplifier unit 210, and a resistor R1 as well as a capacitor C0, for input to the output power detection circuit 220, are mounted on one ceramic board, thereby constituting the power module.

The output power detection circuit 220 is configured such that while a voltage identical to a gate voltage of the power amplification FET 213 in the final stage is delivered thereto via the resistor R1, an AC signal taken out via the capacitor C0 with one of terminals thereof, connected to the drain terminal of the power amplification FET 213 in the final stage, is delivered thereto, thereby detecting output power on the basis of the voltage, and the AC signal.

Figure 2:
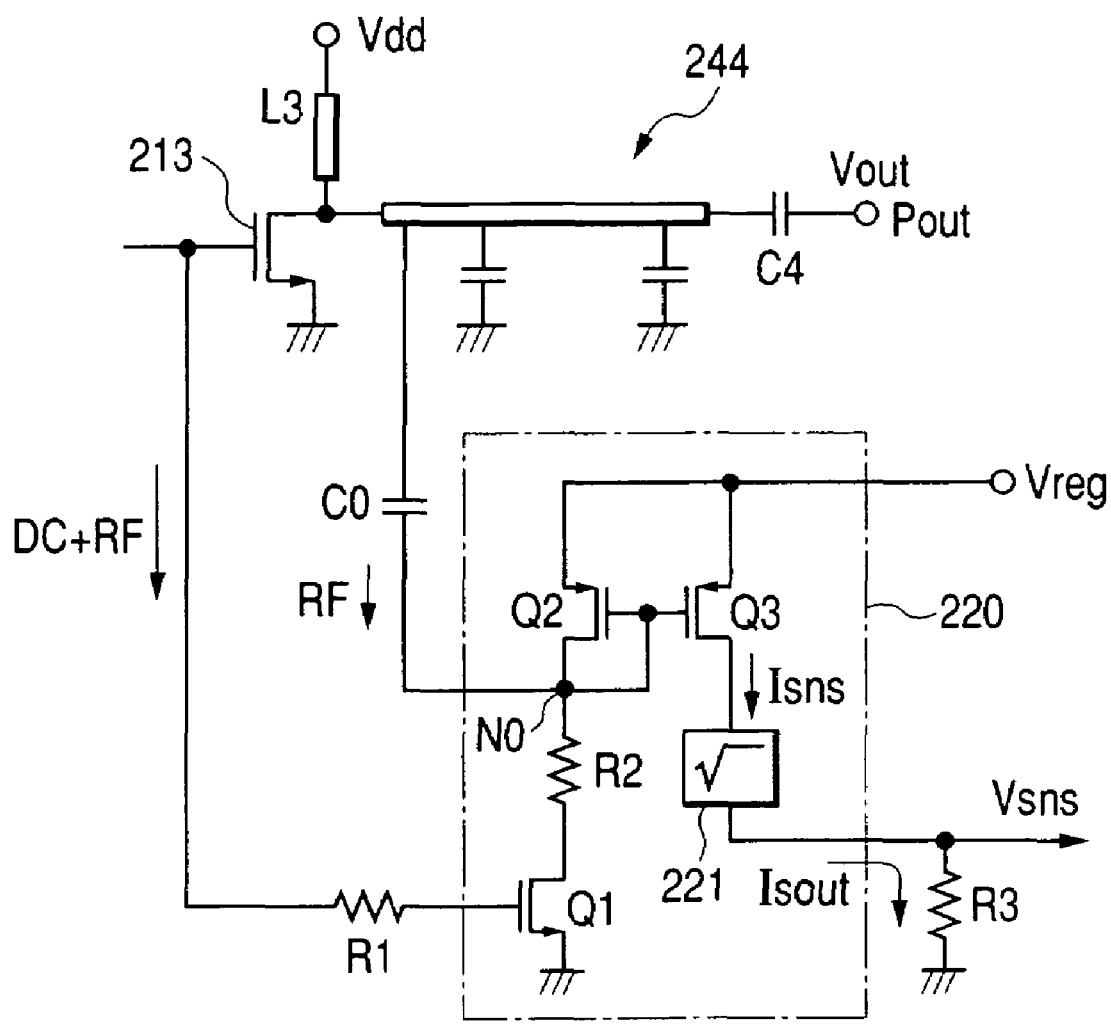
FIG. 2 is a circuit diagram showing an output power detection circuit 220 of the high frequency power amplifier in FIG. 1, according to a first embodiment.

FIG. 2 is a circuit diagram showing the output power detection circuit 220 of the high frequency power amplifier in FIG. 1, according to a first embodiment.

The output power detection circuit 220, shown in FIG. 2, comprises a detection transistor Q1 where the voltage identical to the gate voltage of the power amplification FET 213 in the final stage is delivered to the gate terminal thereof via the resistor R1, and current proportional to a drain current of the power amplification FET 213 flows therethrough, a MOS transistor Q2 connected in series to a resistor R2 between the drain terminal of the transistor Q1 and a power source voltage terminal, a MOS transistor Q3 whose gate commonly connected to the gate of the transistor Q2, a square root conversion circuit 221 connected to the drain terminal of the transistor Q3, for converting a drain current flowing in the transistor Q3 into a current Isout equivalent to the square root of the drain current, and a current-voltage conversion resistor R3 for converting the current Isout converted by the square root conversion circuit 221 into a voltage, thereby sending out the voltage as a detection voltage Vsns.

The other of the terminals of the capacitor C0 is connected to a node N0 interconnecting the drain terminal of the MOS transistor Q2, and the resistor R2, and the AC signal taken out from the drain terminal of the power amplification FET 213 in the final stage via the capacitor C0 is impressed on the drain terminal of the MOS transistor Q2. With the MOS transistor Q2, the gate and the drain are joined together, that is, they are in the so-called diode connection wit each other, and the transistors Q2, Q3 constitute a current mirror circuit. With the present embodiment, a size ratio of Q2 to Q3 is set to 1:1, so that a drain current identical to a drain current of Q2 is caused to flow in Q3.

The resistor R2 is for providing a bias close to a saturation state of the power amplification FET 213 in the final stage by checking the drain voltage of the detection transistor Q1, thereby operating in a region close to a saturation region, and has a resistance value on the order of several hundred Ω.

Meanwhile, for the resistor R1 for input, connected to the gate terminal of the detection transistor Q1, use is made of a resistor with a resistance value on the order of several ten Ω so that variation in the gate voltage of the power amplification FET 213 can be fully conveyed to the gate terminal of the detection transistor Q1. The capacitor C0 has capacitance in a range of 0.5 to 100 pF.

Further, with the output power detection circuit 220 according to the present embodiment, as an operational power source voltage thereof, use is made of a constant voltage Vreg with variation less than that for a battery voltage, which is the operational power source voltage Vdd of the power amplification FET 213. The constant voltage Vreg may be either higher, or lower in level than the battery voltage as long as the former is less variable than the battery voltage, however, it is generally regarded better in power efficiency to provide a circuit for generating a voltage lower than the battery voltage than to provide a circuit (a step-up type DC—DC converter) for generating a voltage higher than the battery voltage, so that the operational power source voltage Vreg is preferably lower than the battery voltage. With the present embodiment, the constant voltage Vreg at, for example, 2,8V±0.05V is used. As there has since been available a system configured such that a constant voltage at such a level is supplied from a base band LS1 to the bias control circuit of the high frequency power amplifier unit, it is possible to constitute such that the constant voltage Vreg outputted from the base band LSI from the outside is supplied as the operational power source voltage of the output power detection circuit 220 by utilizing the base band LSI having such a function.

Figure 3:
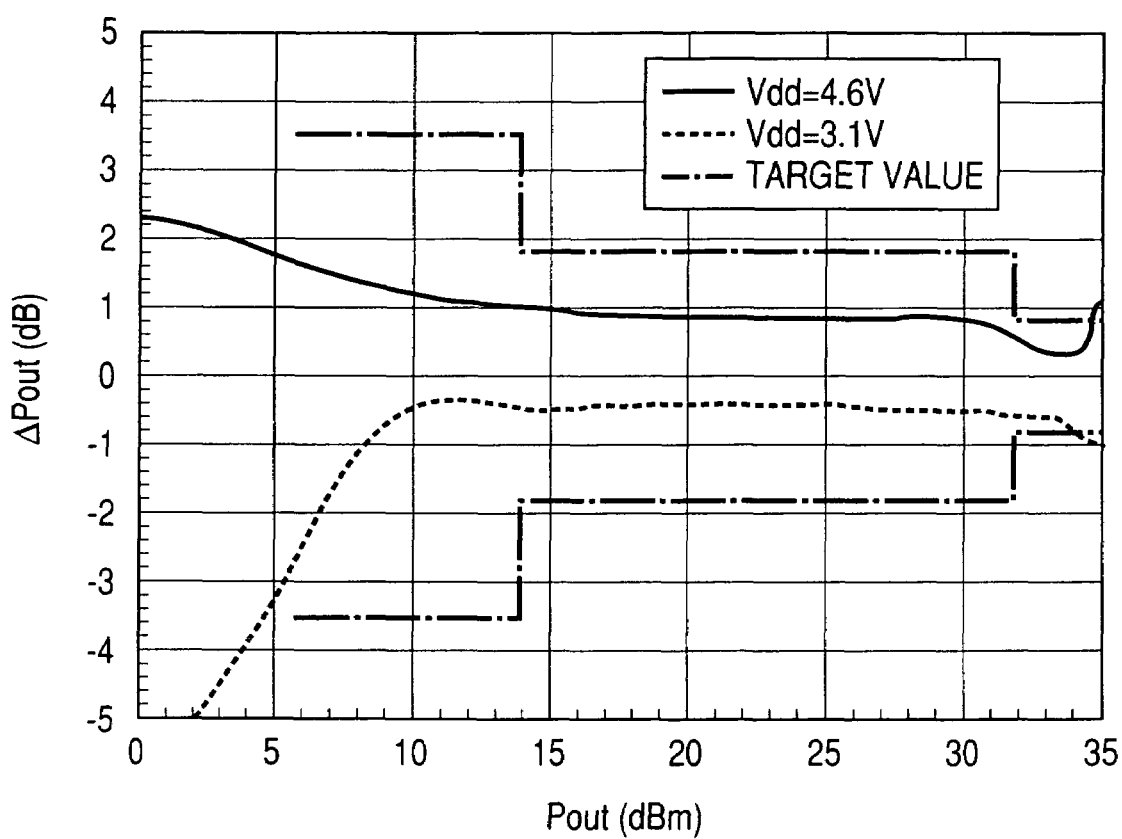
FIG. 3 is a graph showing results of a simulation run to find out output deviation from output power Pout in a system shown in FIG. 1, to which the invention is applied.

As described above, with the present embodiment, since the power source voltage with small variation is used as the operational power source voltage of the output power detection circuit 220, it is possible to lessen dependency of a deviation of the output power on the power source voltage as shown in FIG. 3. In FIG. 3, a solid line indicates a variation Δ Pout from the output power Pout at the standard value (3.5V), as found by running a simulation, in the case where the power source voltage Vdd is at the maximum value (4.6V) within a permissible variation range while a broken line indicates a variation Δ Pout from the output power Pout at the standard value, as found by running a simulation, in the case where the power source voltage Vdd is at the minimum value (3.1V) within the permissible variation range.

Figure 13:
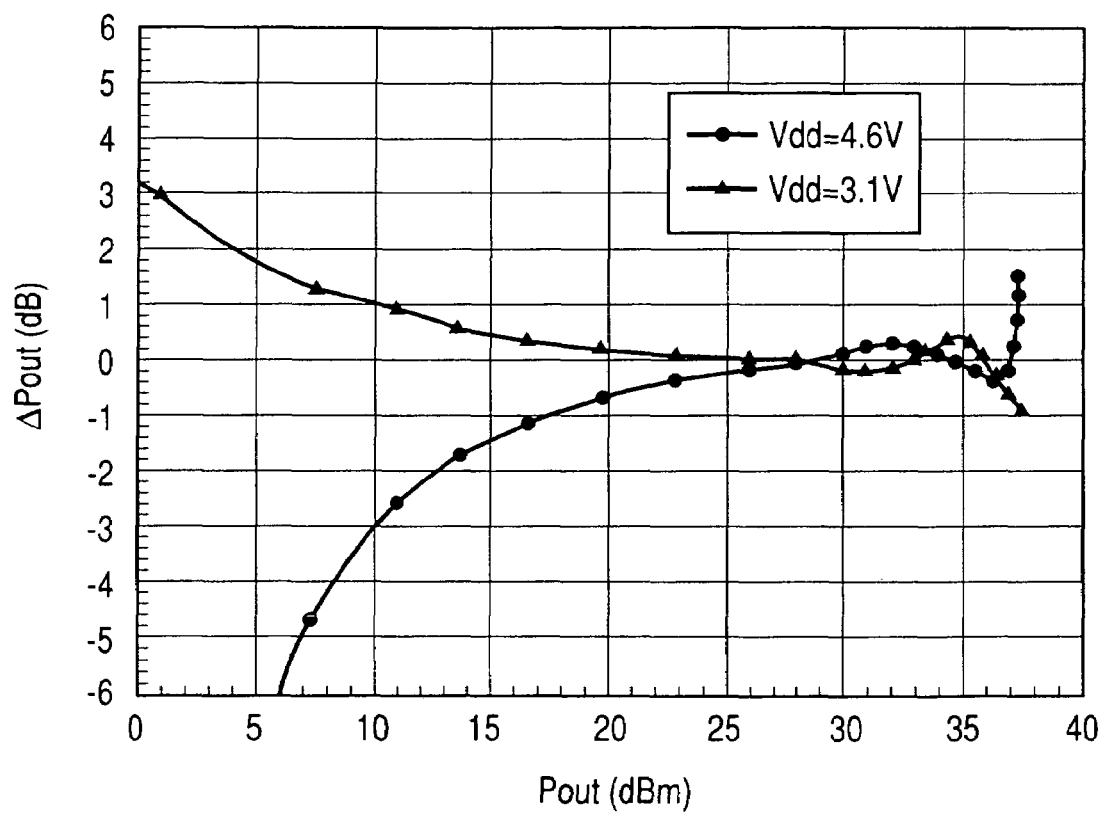
FIG. 13 is a graph showing results of a simulation run to find out output deviation from output power Pout in a feedback control system of a high frequency power amplifier circuit based on a current detection method, examined prior to the development of the invention.

According to the GSM specification, it is stipulated that a deviation Δ Pout of output power Pout be ±6 dB when the output power is in a range of 5 to 11 dBm, and ±4 dB when the output power is in a range of 11 to 35 dBm. In FIG. 3, dash and dotted lines are limit lines indicating a target range decided upon by the inventors by taking into consideration the GSM specification, and desire on the part of users. It is evident from FIG. 3 that the deviation Δ Pout of the output power Pout can be kept substantially within the target range by adoption of the power source voltage with small variation as the operational power source voltage of the output power detection circuit 220. Further, as is apparent by comparing FIG. 3 with FIG. 13, in comparison with the case of using a power source voltage with large variation such as the battery voltage identical to the operational power source voltage of the high frequency power amplifier unit 210 as the operational power source voltage of the output power detection circuit 220, it is possible to lessen variation (swelling) in the deviation Δ Pout of the output power Pout in a high output region.

It was believed before the present invention that better results would be obtained by using a voltage identical to the operational power source voltage of the high frequency power amplifier unit 210 as the operational power source voltage of the output power detection circuit 220 than otherwise because a bias state of the power amplification FET 213 is approximate to a bias state of the detection transistor Q1. However, it has since become evident from FIG. 3 as above that better results are obtained in the high output region by using a voltage with small variation as the operational power source voltage of the output power detection circuit 220. It is believed that this is because, in a low output level region, the power amplification FET 213 and the detection transistor Q1 operate in a relatively linear region away from the saturation region in a gate voltage —drain current characteristic plot, so that there is not much difference in behavior between the two transistors if the respective bias states are approximate to each other, while, in a high output level region, the power amplification FET 213 and the detection transistor Q1 operate in a region of a so-called shoulder characteristic, close to the saturation region, so that respective gate-voltage-variation ranges of the two transistors deviate from each other only if the respective bias states slightly differ from each other, thereby resulting in large deviation in variation amount between respective drain currents.

Further, with the output power detection circuit 220 according to the present embodiment, since there is provided the capacitor C0 for taking out the AC signal from the output side (the drain terminal) of the power amplification FET 213 in the final stage to be delivered to the internal node in the output power detection circuit 220, an output power level can be detected after allowing for the effect of reflected waves, so that detection accuracy can be enhanced as compared with a case where the capacitor C0 is not provided. As with the case of the present embodiment, however, the techniques of using a voltage with variation less than that for the power source voltage of the high frequency power amplifier circuit as the operational power source voltage of the output power detection circuit 220 are effective also for an output power detection circuit for detecting output power by only the current detection method on the basis of the gate voltage of the power amplification FET 213 in the final stage without the capacitor C0 provided.

Still further, with the output power detection circuit 220 according to the present embodiment, since there is provided the square root conversion circuit 221 for converting the drain current flowing in the transistor Q3 into the current equivalent to the square root of the drain current, the output power of the high frequency power amplifier circuit can be controlled with higher precision. The reason for this will be described hereinafter.

Figure 4A:
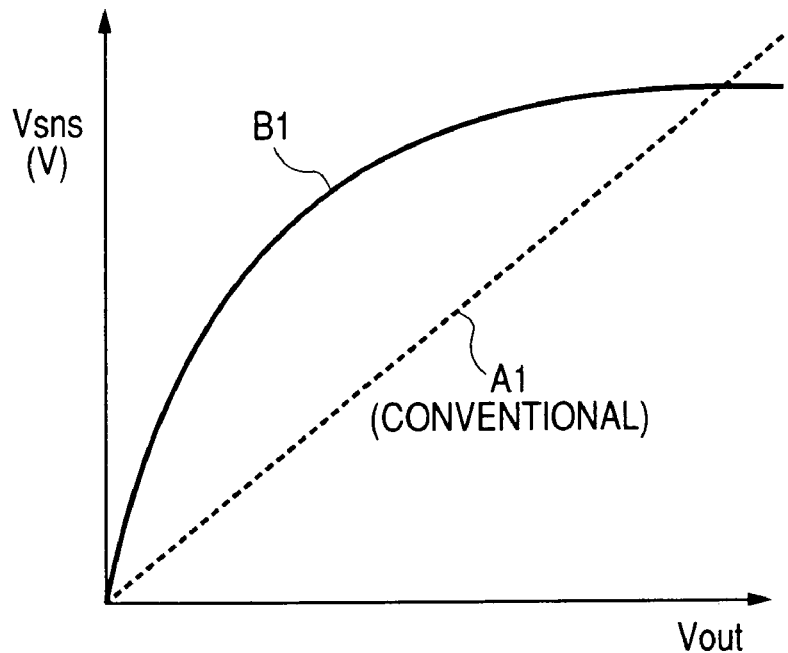
FIGS. 4 (A) and 4 (B) are characteristics plots, in which FIG. 4 (A) indicates a relationship between an output voltage Vout of a power amplifier, and a detection output Vsns, in a feedback control system of the high frequency power amplifier circuit, according to the first embodiment, and under the preceding application, respectively, and FIG. 4 (B) indicates a relationship between an output level designation signal Vramp, and the output power Pout, in the feedback control system of the high frequency power amplifier circuit, according to the first embodiment, and under the preceding application, respectively.
Figure 4B:
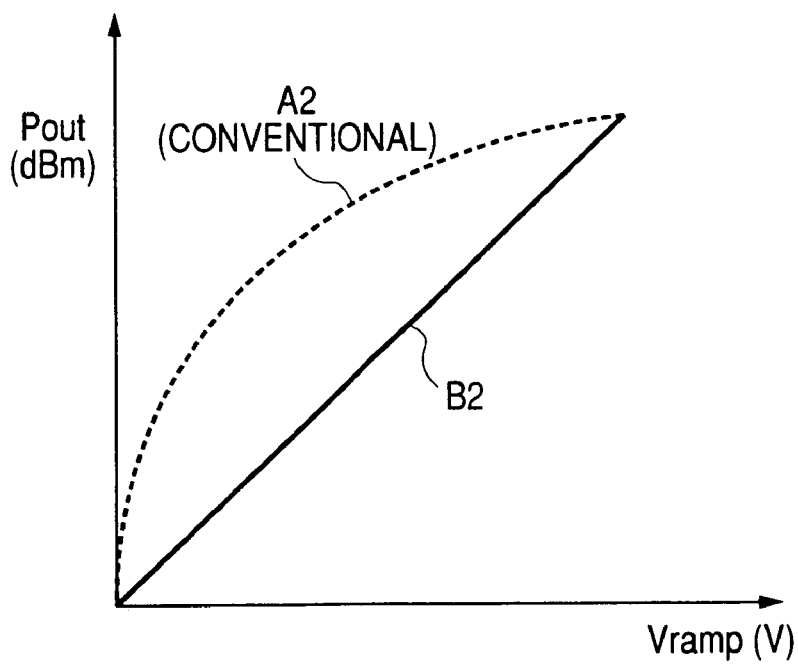
Figure 12:
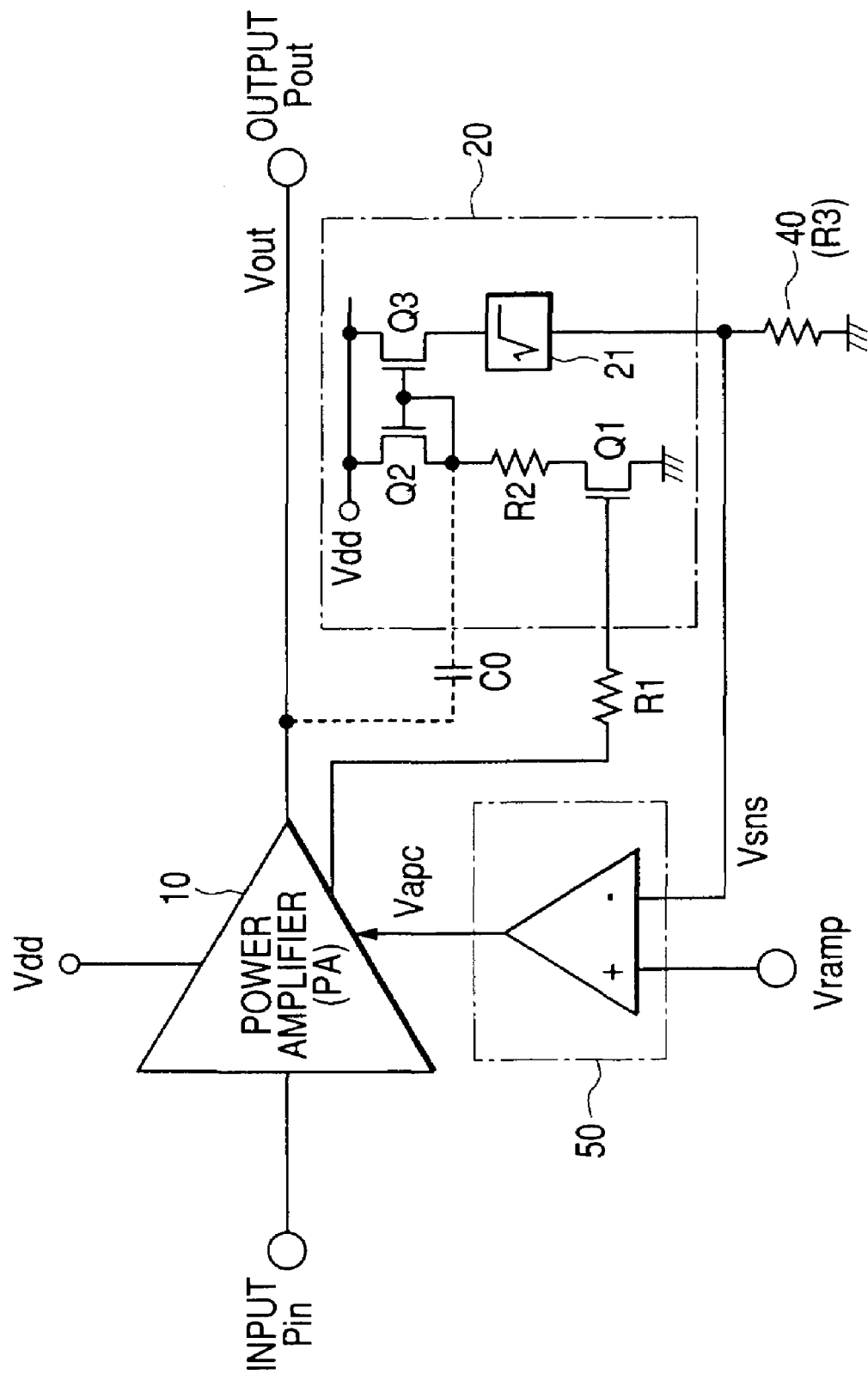
FIG. 12 is a block diagram broadly showing a configuration of a feedback control system of a high frequency power amplifier circuit previously developed by the applicant.

In FIG. 4 (A), a relationship between an output voltage Vout of the high frequency power amplifier circuit, and an output voltage (detection output) Vsns of the output power detection circuit 220, according to the first embodiment, is indicated by a solid line B1. Further, in FIG. 4 (B), a relationship between the output level designation signal Vramp, and the output power Pout, in a control system according to the first embodiment, is indicated by a solid line B2. In FIGS. 4 (A), and 4 (B), broken lines A1, A2 indicate a relationship between an output voltage Vout of the high frequency power amplifier circuit, and an output voltage Vsns of the output power detection circuit 221, and a relationship between the output level designation signal Vramp, and the output power Pout, in a control system shown in FIG. 12, respectively, where the square root conversion circuit 221 according to the first embodiment is not provided. In the case where the square root conversion circuit 221 is not provided, the relationship between the output voltage Vout, and the detection output Vsns becomes substantially linear as indicated by the broken line A1 in FIG. 4 (A), and as a result, magnitude of variation in the output of the high frequency power amplifier circuit, in relation to the output level designation signal Vramp, becomes large in a region of low transmit demand level (a region where Vramp is small) as indicated by the broken line A2 in FIG. 4 (B), that is, control sensitivity undergoes deterioration.

In contrast, with the square root conversion circuit 221, as is evident from FIG. 4 (A), magnitude of variation in the output voltage Vsns of the output power detection circuit 220, in relation to the output voltage Vout, becomes large in a region where the output power Pout is low. As a result, even if magnitude of variation in the output power Pout, in relation to the output level designation signal Vramp, becomes large in the region of low transmit demand level, control sensitivity of the high frequency power amplifier circuit, against the output level designation signal, is enhanced in the region of low transmit demand level, thereby enabling the output power of the high frequency power amplifier circuit to be controlled throughout a control range with high precision.

Figure 5:
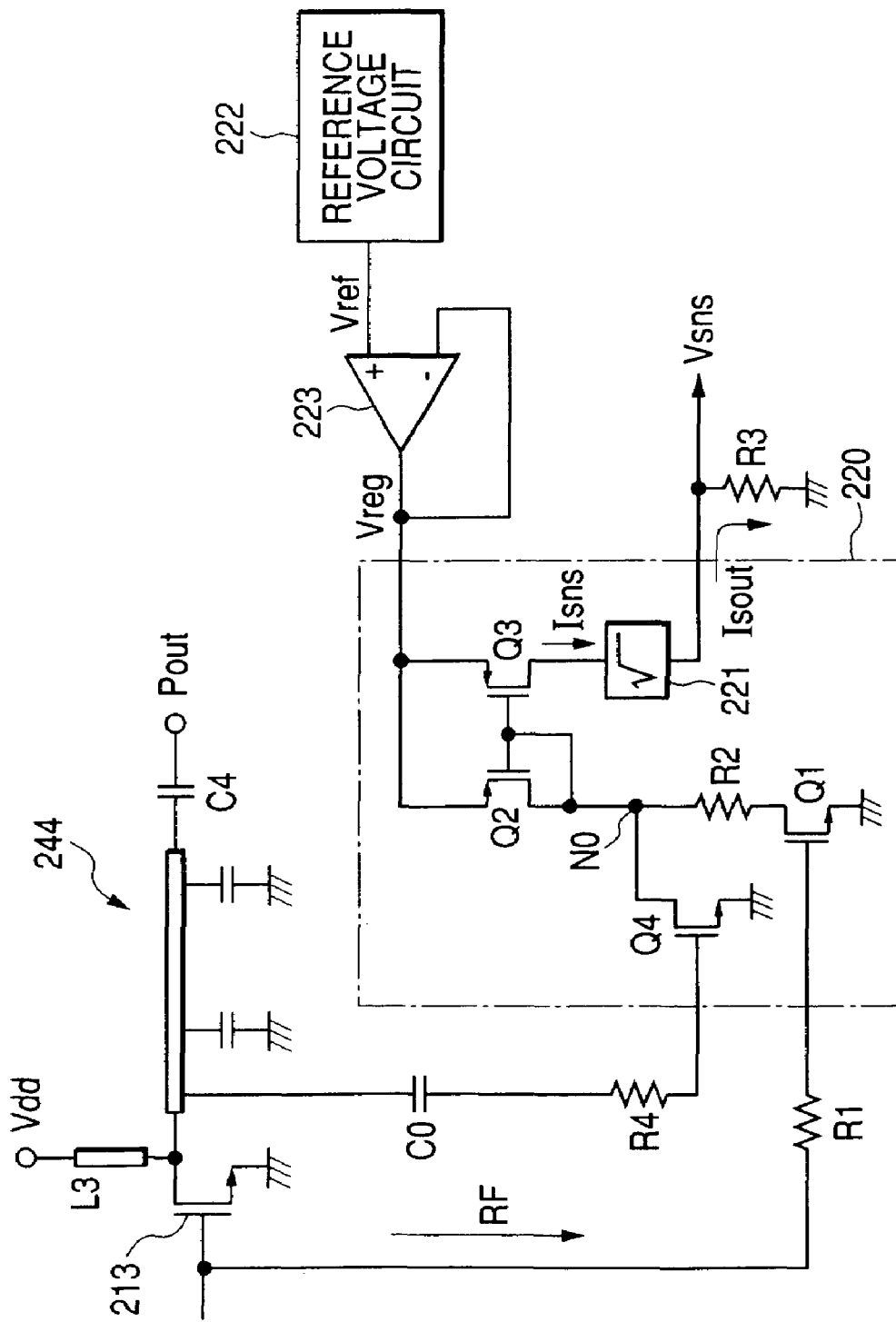
FIG. 5 is a circuit diagram showing a second embodiment of an output power detection circuit 220 of the high frequency power amplifier circuit in FIG. 1, according to the invention.

FIG. 5 shows a second embodiment of an output power detection circuit 220 according to the invention.

The output power detection circuit 220 according to the second embodiment differs from the output power detection circuit 220 according to the first embodiment in that the output power detection circuit 220 according to the second embodiment is provided with a MOS transistor Q4 with a gate terminal on which an AC signal taken out from the drain terminal of the power amplification FET 213 in the final stage via a capacitor C0 is impressed further via a resistor R4, and a drain voltage of the transistor Q4 is impressed on a node N0 interconnecting a drain terminal of a MOS transistor Q2, and a resistor R2 in contrast to the output power detection circuit 220 according to the first embodiment, where the AC signal taken out from the drain terminal of the power amplification FET 213 in the final stage via the capacitor C0 is impressed on the node N0 interconnecting the drain terminal of the MOS transistor Q2, and the resistor R2. Further, the present embodiment has a configuration in which a constant voltage Vreg as the power source voltage of the output power detection circuit 220 is developed by a reference voltage generation circuit 222 for generating a reference voltage Vref having no dependency on a power source, such as a bandgap reference circuit, and a voltage follower 223 for impedance conversion of the output of the former.

With the output power detection circuit 220 according to the present embodiment as well, besides the detection transistor Q1 in which a current proportional to the drain current of the power amplification FET 213 in the final stage of the high frequency power amplifier circuit flows, there is provided the capacitor C0 for taking out the AC signal from the output side of the power amplification FET 213 to be delivered to the output power detection circuit 220, so that an output power level can be detected after allowing for the effect of reflected waves, thereby enabling detection accuracy to be enhanced as compared with a case where the capacitor C0 is not provided. Further, the voltage follower 223 can have a configuration such that a voltage obtained by dividing the output thereof by series connected resistors is caused to feed back to the inverting input terminal of an amplifier, thereby generating and outputting a voltage at a predetermined potential higher than the reference voltage Vref as delivered.

Figure 6:
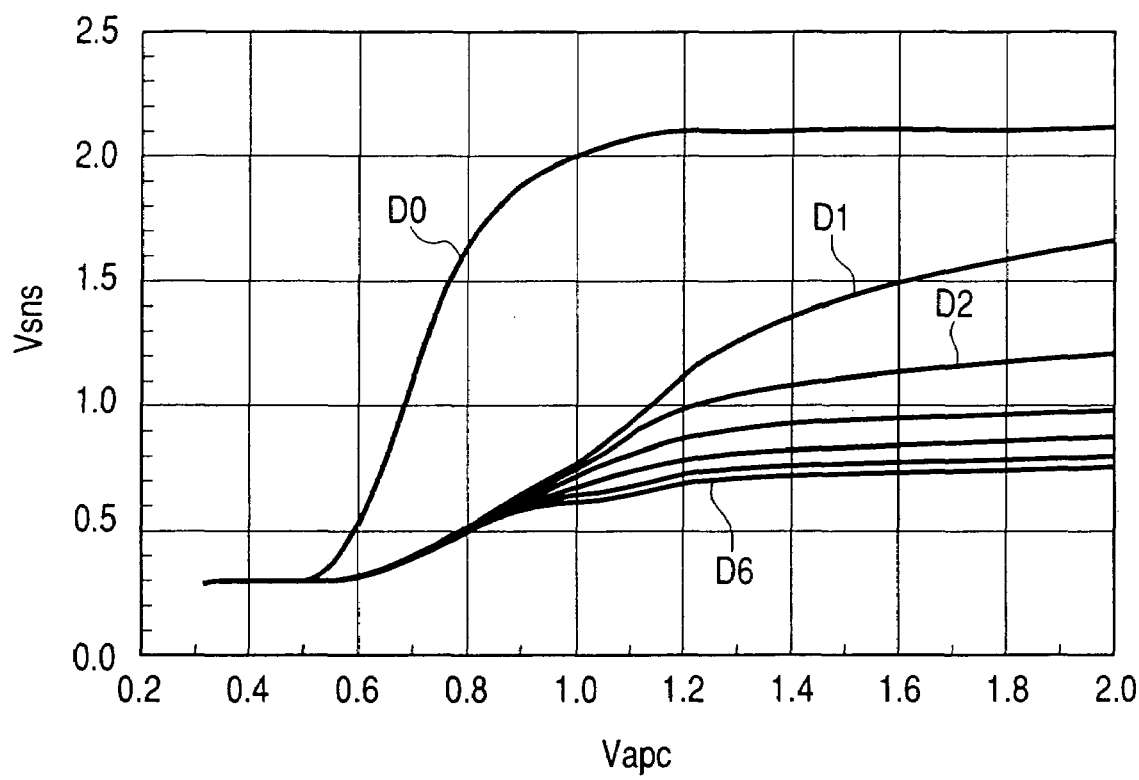
FIG. 6 is a graph indicating a relationship between a solid line DO indicates a relationship between an output control signal Vapc fed to a bias control circuit 230 of the high frequency power amplifier circuit in FIG. 1, for effecting feedback control with the use of the output power detection circuit 220 in FIG. 5, and the detection output Vsns delivered from the output power detection circuit 220.
Figure 7:
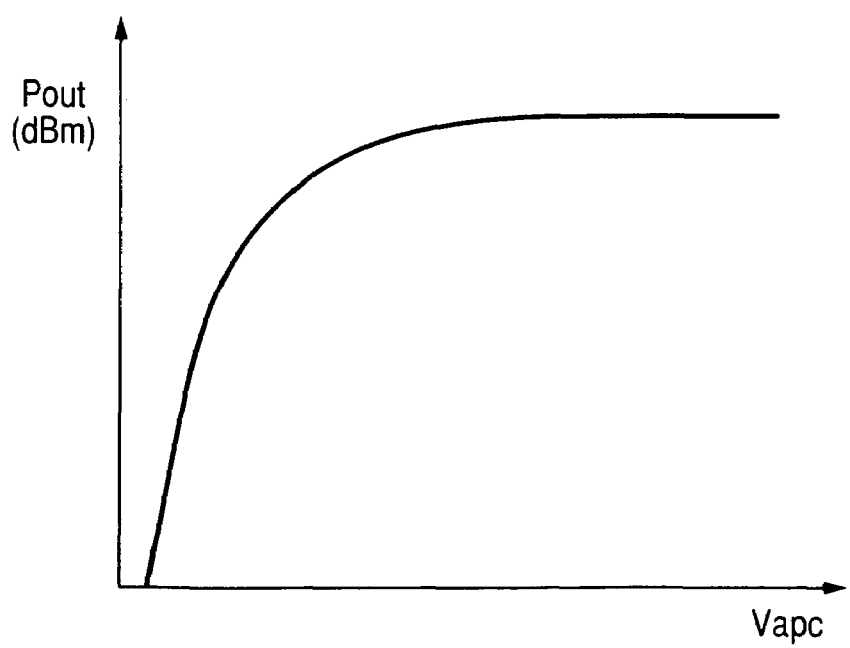
FIG. 7 is a characteristics plot indicating a relationship between the output control signal Vapc, and the output power Pout, in the high frequency power amplifier circuit in FIG. 1.

In FIG. 6, a solid line D0 indicates a relationship between the output control signal Vapc that is fed to the bias control circuit 230 of the high frequency power amplifier circuit in FIG. 1, for effecting feedback control with the use of the output power detection circuit 220 according to the embodiment shown in FIG. 5, and the detection output Vsns delivered from the output power detection circuit 220. Solid lines D1 to D6 each indicate a relationship between the output control signal Vapc, and the detection output Vsns delivered from the output power detection circuit 220 every time a resistance value of the resistor R2 on the drain side of the detection transistor Q1 is gradually increased. FIG. 7 shows a relationship between the output control signal Vapc, and the output power Pout, in the high frequency power amplifier circuit in FIG. 1. In this connection, since FIG. 7 shows characteristics of the high frequency power amplifier circuit in a state where the APC circuit has no feedback control, in the case of detection circuit characteristic having a relationship between Vapc, and Vsns, closer to the relationship between Vapc and Pout, according to the present embodiment, a relationship between Pout, and Vsns becomes more linear, so that it is evident that detection sensitivity will have higher precision.

In FIG. 6, a characteristic indicated by the solid line D6 in the case of the resistance value of the resistor R2 on the drain side of the detection transistor Q1 being at the maximum is close to the characteristic of the detection circuit provided with the detection transistor Q1 only. Upon comparing FIG. 6 with FIG. 7, it is obvious for the reason described as above that in the case of an example D0 in the output power detection circuit according to the present embodiment, where the AC signal is taken out from the output side of the power amplification FET 213 via the capacitor C0 to be taken into consideration, the output power can be detected with higher precision than otherwise.

Figure 8:
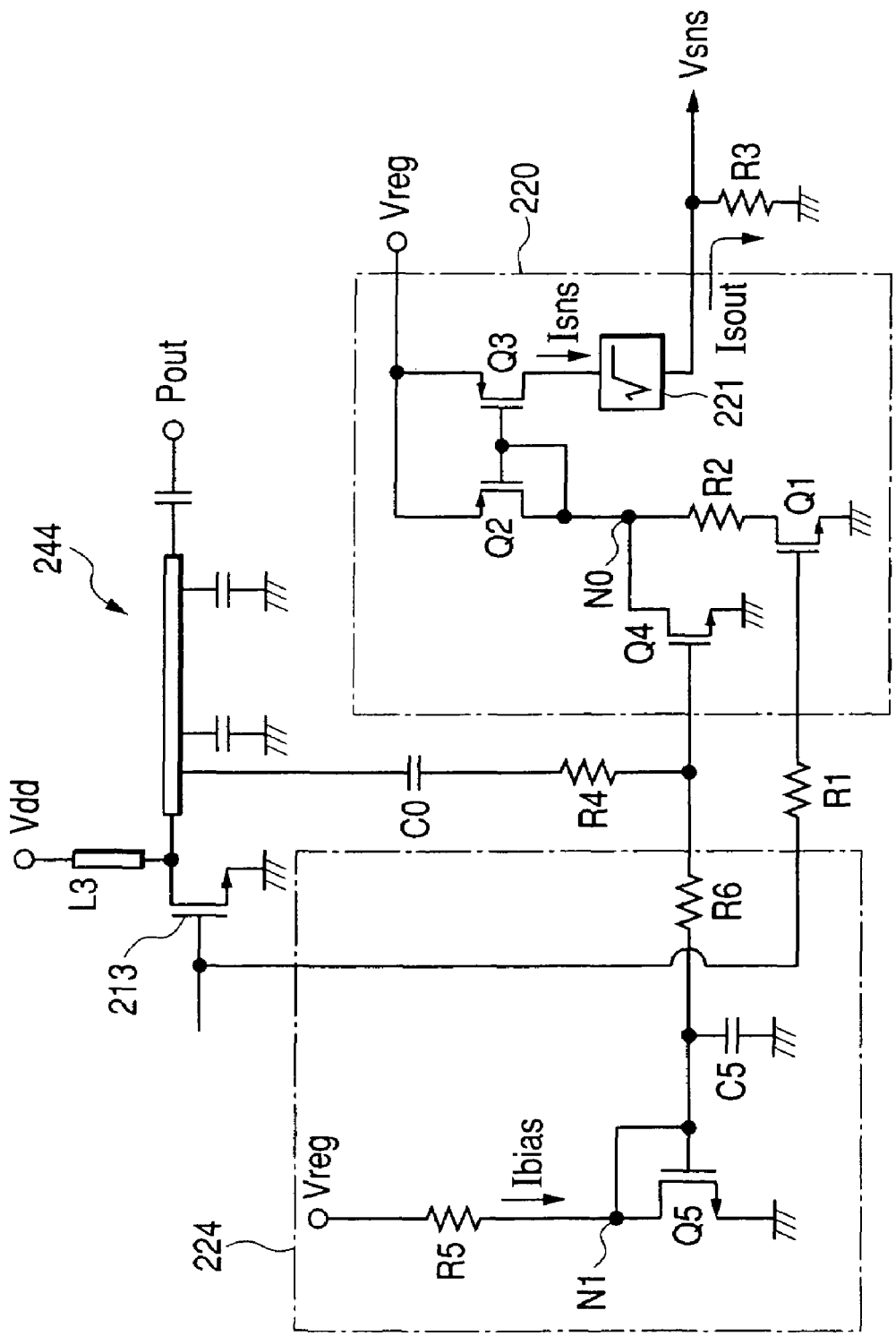
FIG. 8 is a circuit diagram showing a variation of the output power detection circuit 220 according to the second embodiment shown in FIG. 5 by way of example.

FIG. 8 shows a variation of the output power detection circuit 220 according to the second embodiment by way of example.

The variation is the same as the output power detection circuit 220 according to the second embodiment, shown in FIG. 5, further comprising a bias generation circuit 224 for giving a bias voltage, as an operational point, to the gate terminal of the MOS transistor Q4 for receiving the AC signal taken out from the drain terminal of the power amplification FET 213 in the final stage via the capacitor C0.

The bias generation circuit 224 comprises series connected resistor R5 and MOS transistor Q5, extending between a power source terminal on which the constant voltage Vreg is impressed, and a ground point, a resistor R6 connecting the gate terminal of the MOS transistor Q5 to the gate terminal of the current detection MOS transistor Q1, and a capacitor C5 extending between the gate terminal of the MOS transistor Q5, and a ground point. The MOS transistor Q5 is configured such that the gate terminal thereof is joined with the drain terminal thereof to thereby act as a diode. A current Ibias flowing through the resistor R5, and the transistor Q5 decides a potential at a node N1, and the potential is given to the gate terminal of the current detection MOS transistor Q1 as a bias voltage.

With the present embodiment, a voltage value close to a threshold voltage of the current detection MOS transistor Q4 is set as a value for the bias voltage so as to enable the current detection MOS transistor Q4 to undergo B-class amplification operation. By so doing, a current proportional to an AC waveform delivered via the capacitor C0 before undergoing half wave rectification is caused to flow to the MOS transistor Q4, thereby causing a drain current of the MOS transistor G4 to contain a DC component proportional to the amplitude of the AC signal as received. A composite current of the drain current of the MOS transistor G4, and a drain current of the current detection MOS transistor Q1 is transferred to the Q3 side via the current mirror circuit comprised of Q2 and Q3 to thereby undergo square root conversion by a square root conversion circuit 221 to be subsequently converted into a voltage by the resistor R3 before being sent out as the detection voltage Vsns. The resistor R6, and the capacitor C5 act as a low path filter for preventing the AC signal delivered via the capacitor C0 from interfering with the transistor Q5 of the bias generation circuit 224.

Figure 9:
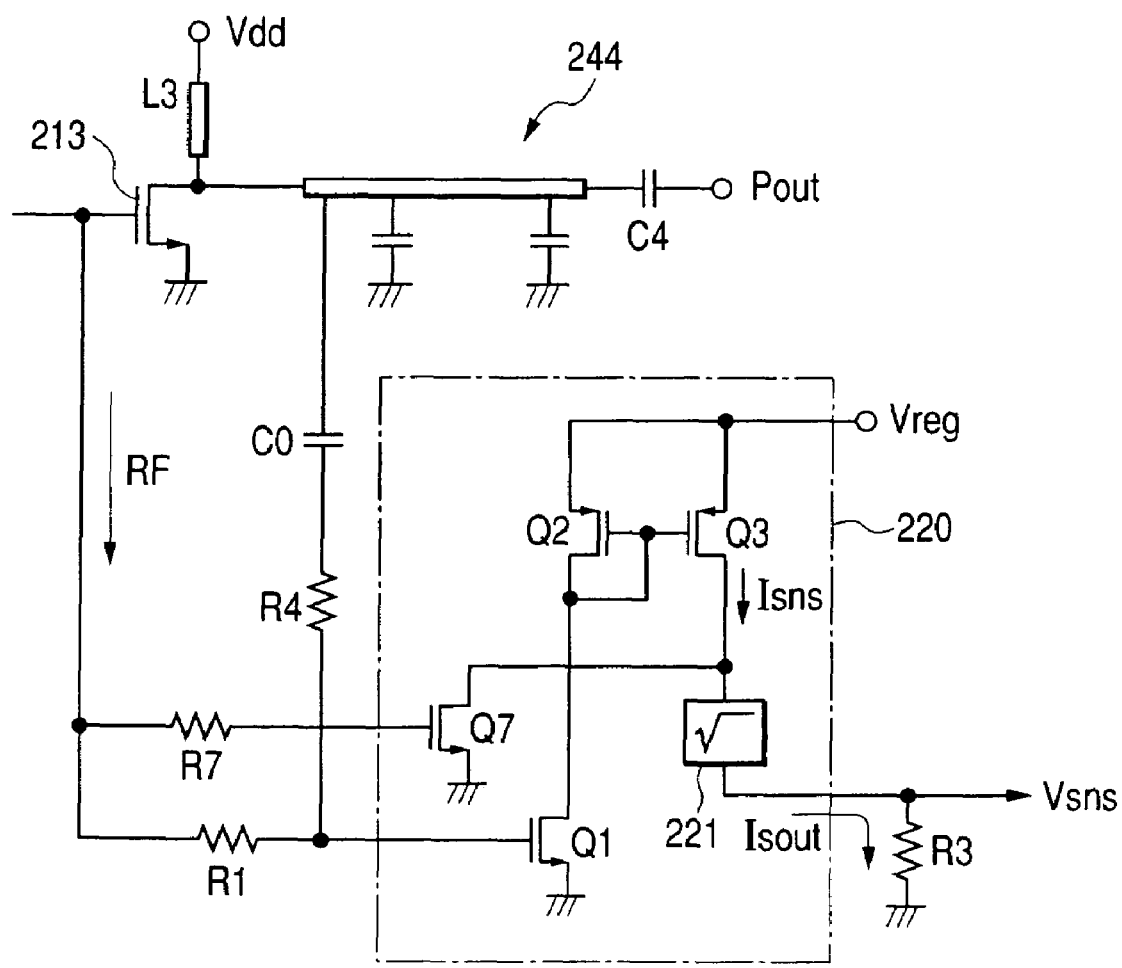
FIG. 9 is a circuit diagram showing a third embodiment of an output power detection circuit 220 of the high frequency power amplifier circuit in FIG. 1, according to the invention.

FIG. 9 shows a third embodiment of an output power detection circuit 220 according to the invention.

The output power detection circuit 220 according to the third embodiment differs from the output power detection circuit 220 according to the second embodiment only in that the AC signal taken out from the drain terminal of the power amplification FET 213 in the final stage via the capacitor C0 is delivered via the resistor R4 to the gate terminal of a current detection MOS transistor Q1 on which a voltage identical to the gate voltage of the power amplification FET 213 in the final stage is impressed, a MOS transistor Q7 with a gate on which the voltage identical to the gate voltage of the power amplification FET 213 in the final stage is impressed via a resistor R7 as with the case of Q1 is provided, and the drain terminal of the MOS transistor Q7 is connected to the drain terminal of the transistor Q3 which is the destination of current mirror transfer. A size ratio of the transistor Q2 to the transistor Q3 may be 1:1.

With the output power detection circuit 220 according to the third embodiment, a composite current of a current proportional to a drain current of the power amplification FET 213 in the final stage plus a current according to an AC signal of an output taken out via the capacitor C0 is caused to flow to the transistor Q1 to be thereby transferred to a transistor Q3 via by means of current mirror, and the composite current minus a drain current of the transistor Q7 to which the current proportional to the drain current of the power amplification FET 213 in the final stage flows as with the case of Q1 is fed to a square root conversion circuit 221 to be thereby converted.

In this case, assuming that a size ratio of the transistor Q1 to the transistor Q7 is 1:M (M>1), by suitably setting a M value, it is possible to suitably determine distribution of detection current between that based on a gate voltage of the power amplification FET 213 in the final stage, and that based on an AC component of the output taken out via the capacitor C0, according to the M value. For example, if the transistors Q1 and Q7 are identical in size, a current fed to the square root conversion circuit 221 is the detection current based on the AC component alone. The output power detection circuit 220 according to the present embodiment is advantageous in that distribution between the detection current based on the gate voltage of the power amplification FET 213, and the detection current based on the AC component of the output taken out via the capacitor C0 can be set according to a system in use.

Figure 10:
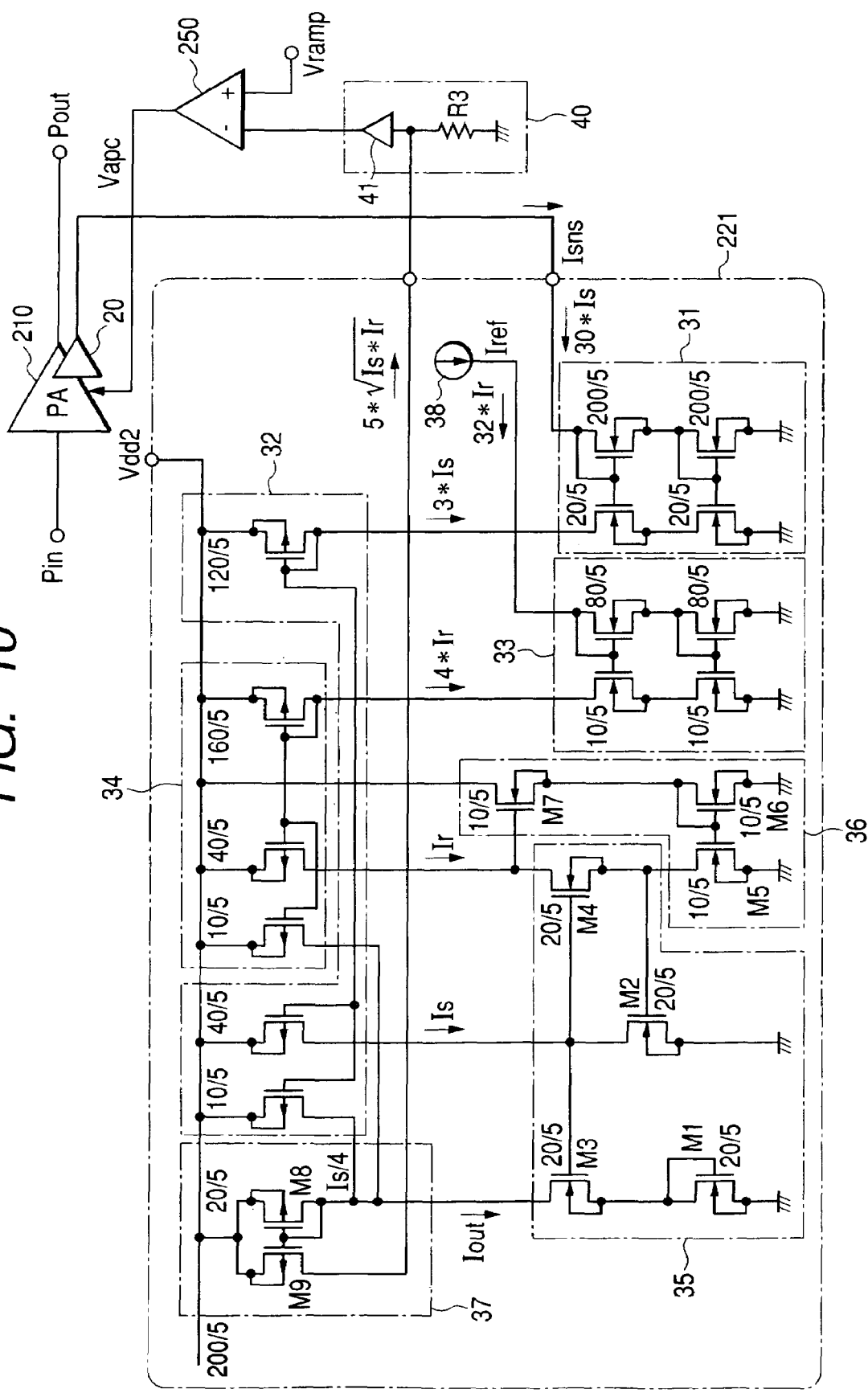
FIG. 10 is a circuit diagram showing a specific circuit example of a square root conversion circuit 221 according to the embodiment of the invention.

FIG. 10 shows a specific circuit example of the square root conversion circuit 221. In FIG. 10, indicated at reference numeral 20 is a portion of circuitry, excluding the square root conversion circuit 221 from the output power detection circuit 220, shown in FIGS. 2, 8, and so on, respectively.

The square root conversion circuit 221 according to the present embodiment comprises a first current mirror circuit 31 comprising n-channel MOSFETs for causing the detection current Isns delivered from the current-mirror transistor Q3 to undergo proportional reduction, a second current mirror circuit 32 comprising p-channel MOSFETs for causing a current at the destination of transfer from the first current mirror circuit 31 to further undergo proportional reduction, a third current mirror circuit 33 comprising p-channel MOSFETs for causing a reference current Iref from a constant current source 38 to undergo proportional reduction, a fourth current mirror circuit 34 comprising p-channel MOSFETs for causing a current at the destination of transfer from the third current mirror circuit 33 to further undergo proportional reduction, an arithmetic circuit 35 for generating a current including a term corresponding to the square root of the detection current Isns with the use of the currents generated by those current mirror circuits, respectively, a bias circuit 36 comprising a MOSFET M5 connected in series to a MOSFET M4 of the arithmetic circuit 35, where a current identical to a current in the MOSFET M4 is caused to flow, a MOSFET M6 connected via current-mirror to the MOSFET M5, and a MOSFET M7 connected in series to the MOSFET M6, wherein an operational point between MOSFETs M2 and M4, making up the arithmetic circuit 35, is given by impressing a drain voltage of M4 on the gate of M7, and a current synthesis circuit 37 for outputting a current proportional to the square root of the detection current Isns by subtracting respective currents corresponding to extra terms, other than the term corresponding to the square root, from the current including the term corresponding to the square root of the detection current Isns, generated in the arithmetic circuit 35, with the use of the currents generated by the current mirror circuits 32, 34, respectively.

The current mirror circuits 31 to 34 each generate a current proportionally reduced by setting a size ratio (a gate width ratio) of a pair of the MOSFETs whose respective gates commonly connected with each other to a predetermined value. More specifically, the size ratio (the gate width ratio) of the pair of the MOSFETs is set to predetermined vales, respectively, such that the first current mirror circuit 31 generates a current reduced to 1/10, the second current mirror circuit 32 generates a current reduced to 1/3, and 1/12, the third current mirror circuit 33 generates a current reduced to 1/8, and the fourth current mirror circuit 34 generates a current reduced to 1/4, and 1/16, respectively.

Assuming that a current equivalent to 1/30 of the detection current Isns delivered to a square root circuit 30 is Is, and a current equivalent to 1/32 of the reference current Iref from the constant current source 38 is Ir, currents flowing to respective destinations of transfer from the first current mirror circuit 31, and the third current mirror circuit 33 are 3Is, and 4Ir, respectively, and currents flowing from respective destinations of transfer from the second current mirror circuit 32 and the fourth current mirror circuit 34 to the arithmetic circuit 35 are Is, Ir, respectively.

The arithmetic circuit 35 comprises the MOSFET M2 where the current Is fed from the second current mirror circuit 32 flows between the source and the drain thereof, a MOSFET M4 where a drain voltage of the MOSFET M2 is impressed on the gate terminal thereof, and the current Ir fed from the fourth current mirror circuit 34 flows between the source and drain thereof, the MOSFET M3 where the drain voltage of the MOSFET M2 is similarly impressed on the gate terminal thereof, and a current at the transfer source of the current synthesis circuit 37 is caused to flow thereto, and a MOSFET M1 connected in series to the source side of the MOSFET M3. The MOSFET M1 is configured such that the source and the drain thereof are joined together so as to act as a diode. Further, the MOSFETs M1 to M4 each are designed so as to be mutually identical in size (gate width and gate length), and are provided with a power source voltage Vdd2 set so as to operate in the saturation region while those MOSFETs are fabricated by the same process step to thereby have the same threshold voltage Vth.

In this case, if respective gate-source voltages of the MOSFETs M1 to M4 are expressed by VGS1, VGS2, VGS3, and VGS4, respectively, and respective drain-source voltages thereof are expressed by VDS1, VDS2, VDS3, and VDS4, respectively, while focusing attention on a node N1 of the arithmetic circuit 35, potential Vn1 at the node N1 is determined as Vn1=VGS1+VGS3 from the side of the MOSFETs M1 and M3, and as Vn1=VDS2+VDS4 from the side of the MOSFETs M2 and M4, and since both the potentials are equal to each other, the following equation results:

$$VGS1+VGS3=VGS2+VGS4$$

As the MOSFETs M1 and M3 are series connected to each other, respective currents flowing therein are equal in magnitude (Iout in the figure), the current Is flows from the current mirror circuit 32 to the MOSFET M2, and the current Ir flows from the current mirror circuit 34 to the MOSFET M4, so that the equation described as above can be expressed by the following equation (1) on the basis of a formula expressing drain current characteristics in the saturation region of a MOSFET:

$$2[Vth+\sqrt{(2/\beta)\cdot(L/W)/(1+\lambda\cdot VDS)}\cdot\sqrt{Iout}]=Vth + \sqrt{(2/\beta)\cdot(L/W)/(1+\lambda\cdot VDS)}\cdot\sqrt{Is}+Vth+\sqrt{(2/\beta)\cdot(L/W)/(1+\lambda\cdot VDS)}\cdot\sqrt{Ir} \quad (1)$$

In the above equation (1), respective element sizes L/W of the MOSFETs M1 to M4 are equal, and $\lambda\cdot VDS$ is negligibly small in relation to "1" because of the element characteristics of the MOSFETs, so that the equation (1) can be tidied up as follows:

$$\sqrt{Iout}=(\sqrt{Is}+\sqrt{Ir})/2 \quad (2)$$

Subsequently, the above equation (2) can be replaced by the following equation:

$$Iout=(Is+Ir)/4+\sqrt{(Is\cdot Ir)}/2 \quad (3)$$

Thus, the equation (3) includes an extra term (Is +Ir)/4, but shows that the current Iout flowing in M3 can be expressed by the square root of the detection current Is.

Further, in the circuit according to the embodiment shown in FIG. 10, there is provided the current synthesis circuit 37 comprising current mirror MOSFETs M8, M9, whose respective gates commonly connected with each other, and the current synthesis circuit 37 is configured such that both a current Is /4 fed from the second current mirror circuit 32, and a current Ir/4 fed from the fourth current mirror circuit 34, added to a current flowing in the MOSFET M8 as the source of current mirror transfer, are sent out as the current Iout. Furthermore, the MOSFETs M8, and M9 are designed such that a size ratio thereof is 1:10. As a result, a current ten times as large as a current less by (Is +Ir)/4 than Iout is caused to flow to the MOSFET M9 current-mirror connected to the MOSFET M8.

Now, it is shown that the current (Is +Ir)/4 added up by the current synthesis circuit 37 corresponds to a first term of the above equation (3). Accordingly, the current flowing to the MOSFET M9 becomes ten times as large as a second term of the above equation (3), that is, $10 \cdot \sqrt{(Is \cdot \sqrt{Ir})/2} = 5 \cdot \sqrt{(Is \cdot Ir)}$. In the circuit according to the embodiment shown in FIG. 10, the current described is sent out. Accordingly, output current from this circuit is a current proportional to the square root of Is.

Meanwhile, as described above, the current Is corresponds to 1/30 of the detection current Isns of the output power detection circuit 220. Accordingly, the output current from the circuit shown in FIG. 10 becomes a current proportional to the square root of the detection current Isns of the output power detection circuit 220. Then, this current is caused to flow to a resistor R3 of a current-voltage conversion 40 to be converted into a voltage, and the voltage as converted undergoes impedance transduction by a buffer 41 to be thereby fed to the differential amplifier 250.

Since temperature coefficient is not included in the equation (3), an output current of the square root circuit according to the present embodiment has no temperature dependence, so that if the reference current Iref is constant, operation characteristics are constant regardless of change in ambient temperature, thereby enabling highly stable conversion to be implemented. As a constant current source supplying a constant current regardless of change in temperature, there has been known a constant current circuit effecting temperature compensation by combining an element having positive temperature characteristics with an element having negative temperature characteristics, so that the reference current Iref suitable for use in the square root circuit according to the present embodiment can be generated to be thereby fed by utilizing such a constant current circuit having no temperature dependence as the constant current source 38.

Still further, with the circuits according to the embodiment shown in FIG. 10, the circuits each comprised of pairs of the MOSFETs current-mirror connected to each other, stacked up in two stages, are used in the first current mirror circuit 31, and the third current mirror circuit 33, respectively, and this is intended to reduce dependency of respective generated currents on the power source voltage. Accordingly, in the case where a highly stable voltage is supplied as the operational power source voltage Vdd2 of the square root conversion circuit 221, the circuit described as above may be replaced by a current mirror circuit in one stage as with the case of the current mirror circuits 32, 34, respectively, on the side of the p-channel MOSFETs.

Figure 11:
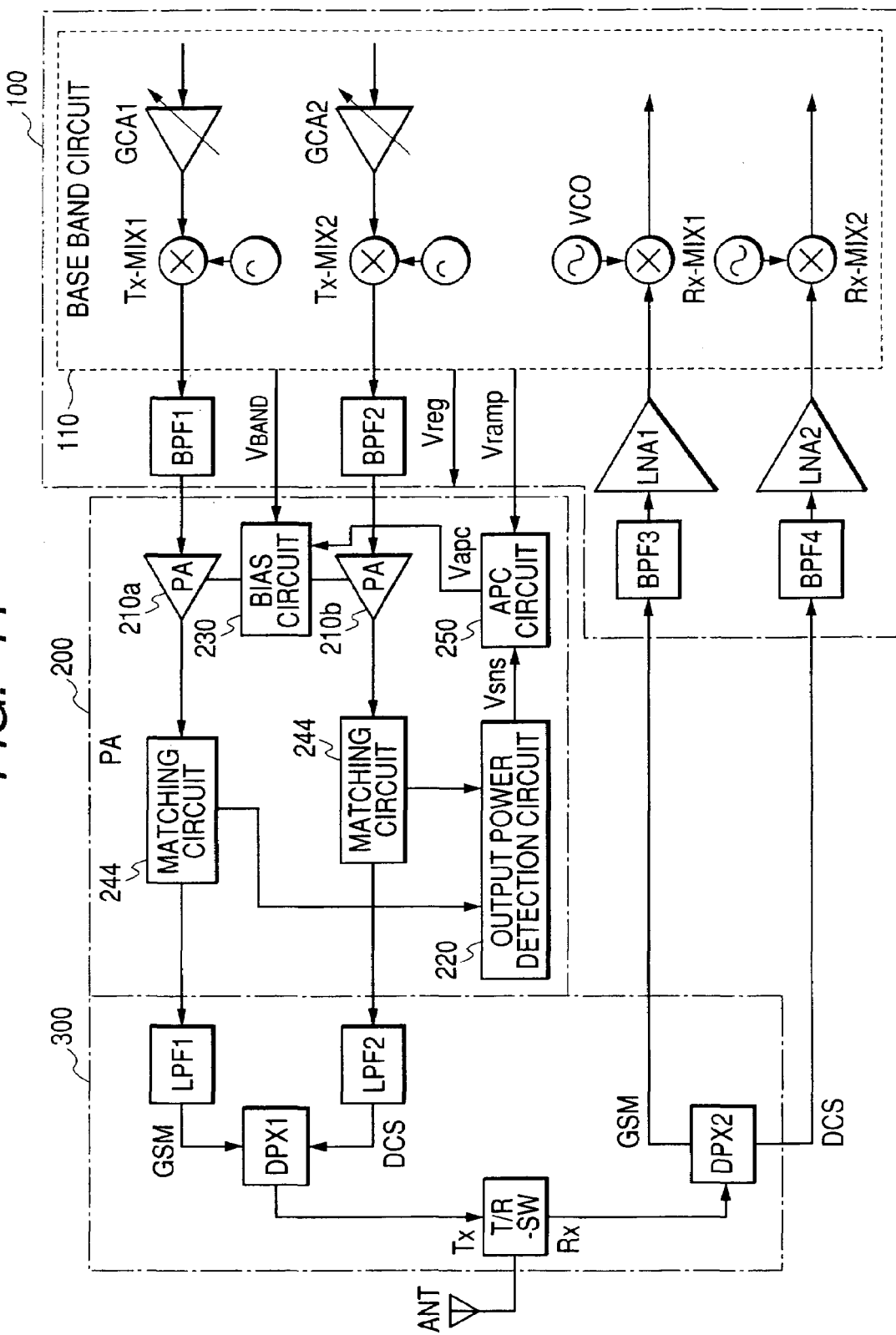
FIG. 11 is a block diagram broadly showing a configuration of a dual band type communication system capable of radio communication based on two communication modes of GSM and DCS, to which the present invention is applied.

Next, FIG. 11 is a block diagram broadly showing a configuration of a dual band type communication system capable of radio communication based on GMSK communication method, in two bands of GSM (Global System for Mobile Communication) using frequency in 900 MHz band, and DCS (Digital Cellular System) using frequency in 1800 MHz band, as an example of a radio communication system to which the power module according to the present embodiment can be effectively applied.

In FIG. 11, ANT denotes an antenna for transmitting and receiving signal radio waves, and reference numeral 100 denotes an electronic device (hereinafter referred to as an RF device) comprising a high frequency signal processing circuit (base band circuit) 110 incorporating a modulation-demodulation circuit capable of executing GMSK modulation and demodulation in the systems of GSM and DCS, and a circuit for generating I, Q signals based on transmitting data (base band signals), and processing the I, Q signals as extracted from receiving signals, a semiconductor integrated circuit for processing high frequency signals (base band IC) having low noise amps LNA1, LNA2, and so forth, for amplifying the receiving signals, formed on one semiconductor chip, and bandpath filters BPF1, BPF2, for removing harmonic components from transmitting signals, and bandpath filters BPF3, BPF4, and so forth, for removing unnecessary radio waves from the receiving signals, all the above components being mounted in one package. Tx-MIX1, Tx-MIX2 each are mixers for up-converting the transmitting signals of GSM and DCS, respectively, while Rx-MIX1, Rx-MIX2 each are mixers for down-converting the receiving signals of GSM and DCS, respectively.

Further, in FIG. 11, reference numeral 200 denotes the power module according to the above-described embodiment for amplifying high frequency signals fed from the base band IC 100, and reference numeral 300 denotes a front end module comprising low path filters LPF1, LPF2, for removing noises such as harmonics and so forth, contained in the receiving signals, branching filters DPX1, DPX2, for synthesis of GSM signals with DCS signals, or separation of the GSM signals from the DCS signals, and a switch T/R–SW for switching over between transmitting signals and receiving signals.

As shown in FIG. 11, with the present embodiment, a mode select signal (control signal) VBAND indicating whether it is the case of GSM or the case of DCS is fed from the base band circuit 110 to the bias control circuit 230, whereupon the bias control circuit 230 generates a bias current according to a relevant mode based on the control signal VBAND to thereby feed the bias current to either a power amp 210a or 210b. Further, the output level designation signal Vramp is fed from the base band circuit 110 to the APC circuit (the differential amplifier) 250, whereupon the APC circuit (the differential amplifier) 250 generates the control voltage Vapc against the bias control circuit 230 by comparing the output level designation signal Vramp with the detection voltage Vsns delivered from the output power detection circuit 220, and the bias control circuit 230 controls respective gains of the power amps 210a, 210b according to the control voltage Vapc such that respective output power of the power amps 210a, and 210b are changed accordingly.

Furthermore, besides the above-described device and module, there may be provided a microprocessor (CPU) (not shown in FIG. 11) for controlling the system in whole by generating the output level designation signal serving as a base for a control signal and a power control signal PCS against the RF device 100.

Having specifically described the invention developed by the inventors with reference to the embodiments as described hereinbefore, it is our intention that the invention be not limited to any of the embodiments, and it is obvious that various changes and modifications may be made in the invention without departing from the spirit and scope thereof. For example, with the high frequency power amplifier according to the embodiments, the output power detection circuit is provided with the square root conversion circuit 221, however, a configuration may be adopted such that the square root conversion circuit 221 is omitted, and the drain current of the transistor Q3 of the current mirror circuit may be caused to flow directly to the resistor R3 to be thereby converted into voltage. With the embodiments, the LDMOS is used for the power amplification elements 211 to 213, respectively, however, instead of the LDMOS, use may be made of other transistors such as a MOSFET formed by the normal CMOS process CMOS, bipolar transistor, GaAsMESFET, hetrostructure bipolar transistor (HBT), HEMT, and so forth.

Still further, with the embodiments described above, the capacitor C0 for taking out the AC signal to the output power detection circuit 220 is coupled to a region close to the drain terminal of the power amplification FET 213 in the final stage of the high frequency power amplifier unit, however, the capacitor C0 may be coupled to a region part of the way in the impedance matching circuit 244 or to a region close to the terminal end thereof.

In the foregoing description, there has been described primarily the case where the invention developed by the inventors is applied to the power module, as a constituent of the dual band radio communication system capable of transmitting and receiving signals through two communication systems of GSM, and DCS, which is an application field in the background of the invention, however, the invention is not limited thereto, and can be utilized for a power module, as a constituent of a multi-band radio communication system such as a cellular phone, mobile phone and so forth, capable of transmitting and receiving signals through other communication systems, and not less than three communication-band-systems including GSM, DCS, and PCS (Personal Communications System).

What is claimed is:

1. A power module, comprising:
   an amplification means for amplifying a first signal (Pin) to be amplified;
   a bias means for supplying bias voltages to the amplification means;
   a detection means for detecting an output power of the amplification means and for generating a second signal (Vsns) which indicates the output power the amplification means;
   a comparison means for comparing the second signal with a third signal (Vramp) which designates the output power of the amplification means and for supplying a forth signal (Vapc) to the bias means;
   a first power source voltage terminal which is coupled to the detection means and supplies a first operational power source voltage (Vreg) to the detection means; and
   a second power source voltage terminal which is coupled to the amplification means supplies a second operational power source voltage (Vdd) different from the first operational power source voltage (Vreg),
   wherein the detection means further comprising a detection transistor (Q1) which is connected to a first resistor (R2) coupled between an output terminal of the detection transistor (Q1) and the first power source voltage terminal and which receives a fifth signal related to the output power from the amplification means, and
   wherein the first operational power source voltage(Vreg) is set so as to be less in voltage variation than the second operational power source voltage(Vdd).

2. The power module according to claim 1, wherein the detection means further comprising:
   a current transfer means (Q2,Q3) for transferring a current of the detection transistor (Q1) into a first current (Isns), and which is provided between the first resistor (R2) and the first operational power source voltage (Vreg); and
   a conversion means(R3) for converting the first current (Isns) into a voltage, and
   wherein the voltage is supplied to the comparison means as the second signal (Vsns).

3. The power module according to claim 2, wherein the detection means(220) further comprising:
   wherein a current conversion means for converting the first current (Isns) into a second current (Isout) equivalent to the square root of the first current,
   wherein the conversion means (R3) converts the second current (Isns) into the voltage.

4. The power module according to claim 1
   wherein the amplification means comprises a plurality of amplification transistors connected in cascade, and
   wherein the fifth signal is impressed on an input terminal of the amplification transistor in the final stage of the amplification means.

* * * * *